United States Patent
Ishizuka

(10) Patent No.: US 6,731,276 B1
(45) Date of Patent: May 4, 2004

(54) ACTIVE MATRIX LIGHT-EMITTING DISPLAY APPARATUS

(75) Inventor: Shinichi Ishizuka, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/708,855

(22) Filed: Nov. 9, 2000

(30) Foreign Application Priority Data

Nov. 12, 1999 (JP) .......................................... 11-322726

(51) Int. Cl.[7] ................................................ G09G 3/30
(52) U.S. Cl. ........................ 345/211; 345/76; 345/214; 315/169.3
(58) Field of Search ..................... 345/76–81, 211–214; 315/169.3

(56) References Cited

U.S. PATENT DOCUMENTS 5,552,678 A * 9/1996 Tang et al. ............... 315/169.3
5,990,629 A * 11/1999 Yamada et al. .......... 315/169.3
6,380,689 B1 * 4/2002 Okuda ..................... 315/169.3
6,501,227 B1 * 12/2002 Koyama .................. 315/169.3

* cited by examiner

Primary Examiner—Amare Mengistu
Assistant Examiner—Tom Sheng
(74) Attorney, Agent, or Firm—Morgan, Lewis & Bockius LLP

(57) ABSTRACT

A conductive portion of a display panel includes a plurality of strip electrodes each provided for at least one of the scan lines and electrically isolated from one another. A switch circuit is provided for selectively connecting each of the plurality of strip electrodes to the power supply. A reverse bias voltage generating circuit generates reverse bias voltage in a direction opposite to a voltage applied to light-emitting elements when emitting light, and a reverse bias voltage applying circuit selectively applies the reverse bias voltage to the plurality of light-emitting elements via the plurality of strip electrodes.

12 Claims, 14 Drawing Sheets

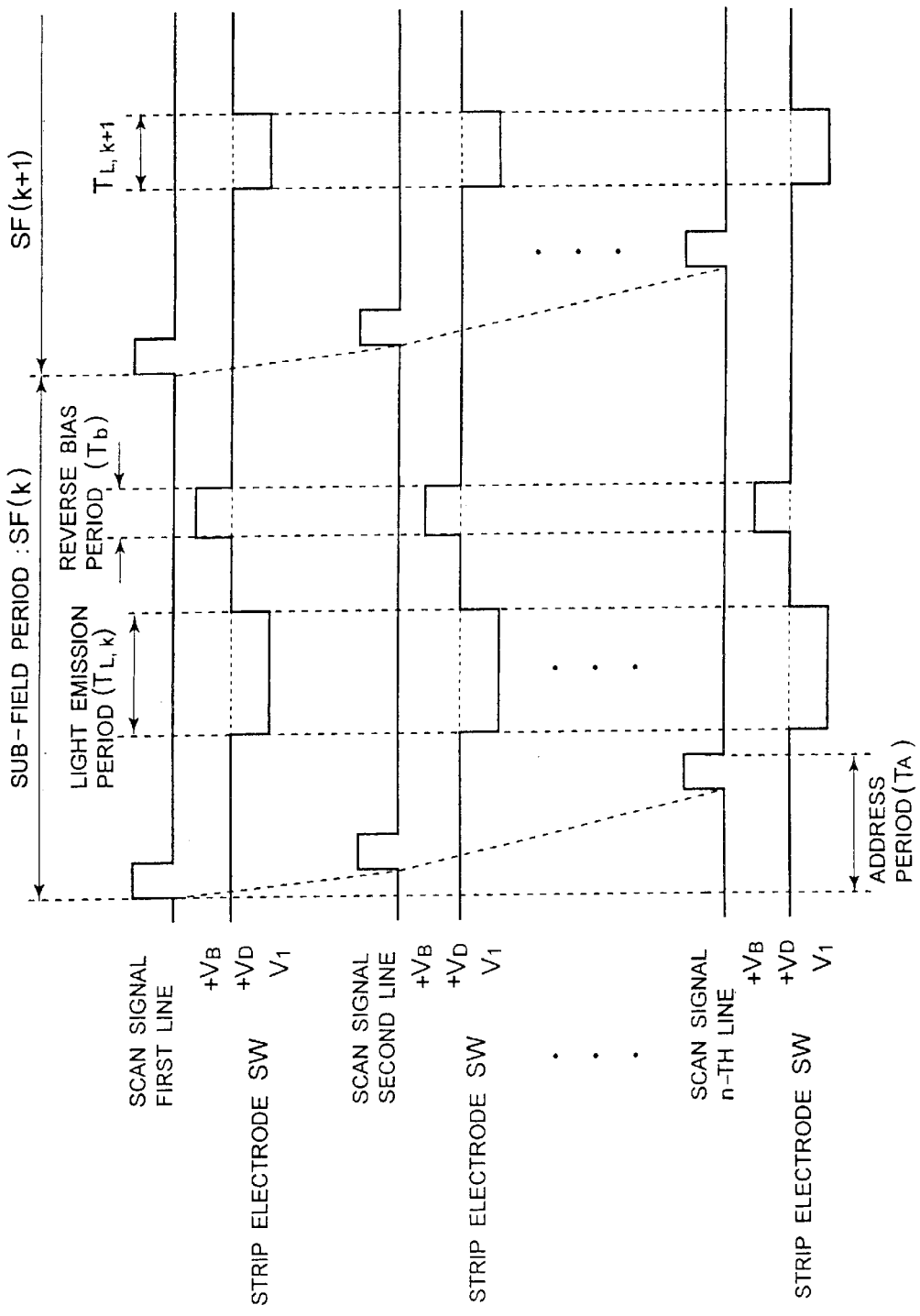

US 6,731,276 B1

ACTIVE MATRIX LIGHT-EMITTING DISPLAY APPARATUS

BACKGROUND OF THE INVENTION

1. Field of the Invention

The present invention relates to an active matrix display apparatus and, more particularly, to a display apparatus including an active matrix display panel having light-emitting elements such as organic electroluminescence elements.

2. Description of the Related Art

A matrix type display including a light-emitting panel is being widely developed. The light-emitting panel includes a plurality of light-emitting elements arranged in a matrix configuration. The light-emitting elements for use in such display panels include, for example, an electroluminescence (EL) element which employs an organic material as a light-emitting layer. The light-emitting luminance can be controlled by a current which flows through in the organic EL element. The light-emitting display panels using the organic EL elements may be classified into a simple matrix display panel and an active matrix display panel. The organic EL elements are merely arranged in a matrix configuration in the simple matrix light-emitting panel. On the other hand, a driving device including a transistor is added to each of the organic EL elements arranged in a matrix configuration in the active matrix light-emitting panel. The active matrix light-emitting panel has advantages such that electric power consumption is smaller and an amount of crosstalk between pixels is smaller as compared with those of the simple matrix light-emitting panels and the like are suitable as a display of a large screen or a high precision display.

FIG. 1 illustrates an example of a circuit configuration corresponding to a pixel 10 of an active matrix display panel according to the prior art.

Referring to FIG. 1, a gate G of a FET (Field Effect Transistor) 11 (an address selection transistor) is connected to an address scan electrode (scan line) through which address signals are supplied. A drain D of the FET 11 is connected to a data electrode (data line) through which a data signal is supplied. A source S of the FET 11 is connected to a gate G of a FET 12 (a drive transistor) as well as to one terminal of a capacitor 13. A source S of the FET 12 is connected to a common anode 16 in conjunction with the other terminal of the capacitor 13. The drain D of the FET 12 is connected to the anode of an organic EL element 15, and a cathode of the organic EL element 15 is connected to a common cathode 17.

As illustrated in FIG. 2, the common anode 16 and the common cathode 17 to which the cathode of each organic EL element 15 is connected are connected to a voltage source 18 for supplying power.

A light emission control operation of the circuit is described hereinbelow. Referring to FIG. 1, an ON voltage supplied to the gate G of the FET 11 causes a current corresponding to a data voltage supplied to the source S to flow from the source S to the drain D. When the gate G of the FET 11 is at an OFF voltage, the FET 11 is in a so-called cut-off state making the drain D of the FET 11 open. Therefore, the capacitor 13 is charged while the gate G of the FET 11 is kept at the ON voltage to supply the voltage of the capacitor 13 to the gate G of the FET 12. Then, a current caused by the gate and the source voltage flows through the organic EL element 15 from the source S to the drain D in the FET 12 to allow the organic EL element 15 to emit light. Moreover, when the gate G of the FET 11 is at the OFF voltage, the FET 11 is made open. Accordingly, the voltage of the gate G in the FET 12 is held with the charge accumulated in the capacitor 13 to sustain the drive current until the next scan and thus the light emission of the organic EL element 15. Incidentally, the same operation as the foregoing can be obtained without the capacitor 13, since gate input capacitance is available between the gate G and the source S of the FET 12.

The circuit corresponding to a pixel of a display panel for controlling light emission by active matrix addressing is configured as described above, and the light emission of the pixel is sustained when the organic EL element 15 of the pixel is driven.

As described above, the light emission of each light-emitting element in an active matrix display panel was controlled by means of a drive circuit that contained drive elements such as FETs.

OBJECT AND SUMMARY OF THE INVENTION

However, the active matrix display apparatus according to the prior art provided only a limited degree of flexibility for the control of the light-emitting elements since the light emission of each light-emitting element was controlled only by means of a drive circuit.

It is therefore an object of the present invention to overcome the problem described above and to provide an active matrix display apparatus having a high degree of flexibility in controlling light-emitting elements.

According to the present invention, there is provided an active matrix display apparatus, which comprises a display panel including a plurality of light-emitting elements arranged at intersections of scan lines and data lines arranged in a matrix configuration, a drive circuit for driving each of the plurality of light-emitting elements, and a conductive portion connected to one terminal of each of the plurality of light-emitting elements, a display controller for controlling the drive circuit in response to an input video signal, and a power supply for supplying electric power to the plurality of light-emitting elements via the conductive portion, wherein the conductive portion includes a plurality of strip electrodes each provided for at least one of the scan lines or the data lines and electrically isolated from one another, and the power supply includes a switch circuit for selectively connecting each of the plurality of strip electrodes to the power supply.

According to another aspect of the present invention, the apparatus further comprises, a reverse bias voltage generating circuit for generating reverse bias voltage in a direction opposite to a voltage applied to the light-emitting elements when emitting light, and a reverse bias voltage applying circuit for selectively applying the reverse bias voltage to the plurality of light-emitting elements via the plurality of strip electrodes.

According to another aspect of the present invention, the display controller includes a timer and controls the switch circuits in response to an output of the timer to selectively connect each of the plurality of strip electrodes to the power supply.

According to the present invention, there is provided an active matrix display panel, which comprises a plurality of light-emitting elements arranged at intersections of scan lines and data lines arranged in a matrix configuration, a drive circuit for driving each of the plurality of light-emitting elements, and a conductive portion connected to one terminal of each of the plurality of light-emitting elements, wherein the conductive portion includes a plurality of strip electrodes each provided for at least one of the scan lines or the data lines and electrically isolated from one another.

BRIEF DESCRIPTION OF THE DRAWINGS

These and other objects and advantages of the present invention will become clear from the following description with reference to the accompanying drawings, wherein:

FIG. 14 is a time chart illustrating a control operation executed by the display controller in the display panel of FIG. 13.

DETAILED DESCRIPTION OF THE PREFERRED EMBODIMENTS

Figure 1:
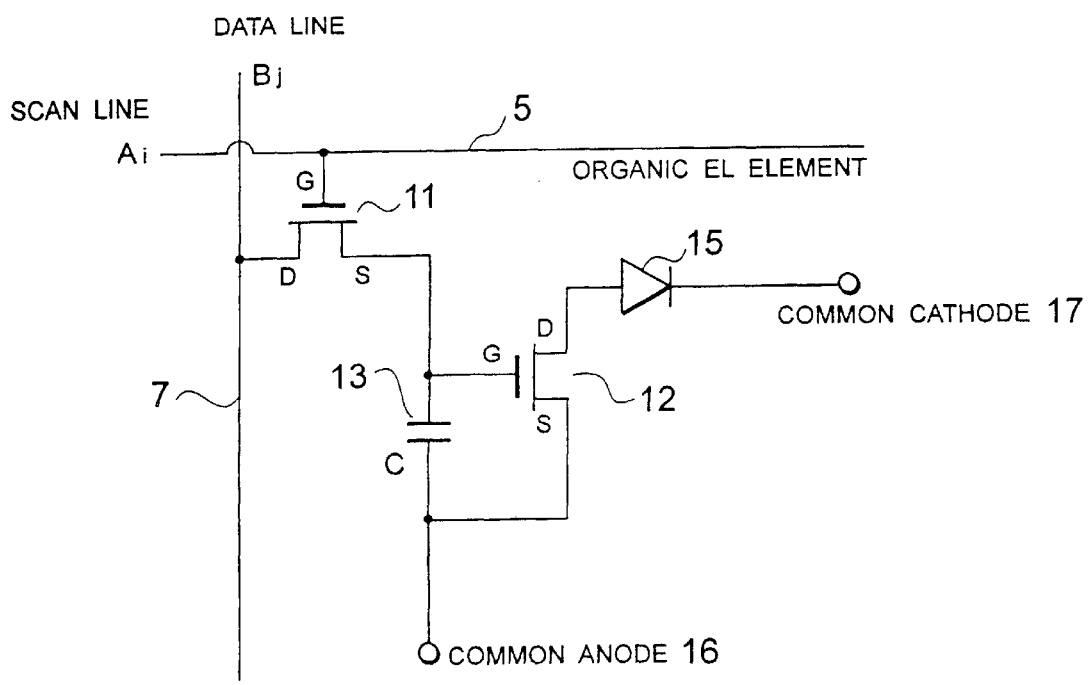
FIG. 1 is a schematic view illustrating an example of the configuration of a circuit corresponding to a single pixel of an active matrix display panel of a prior art.
Figure 2:
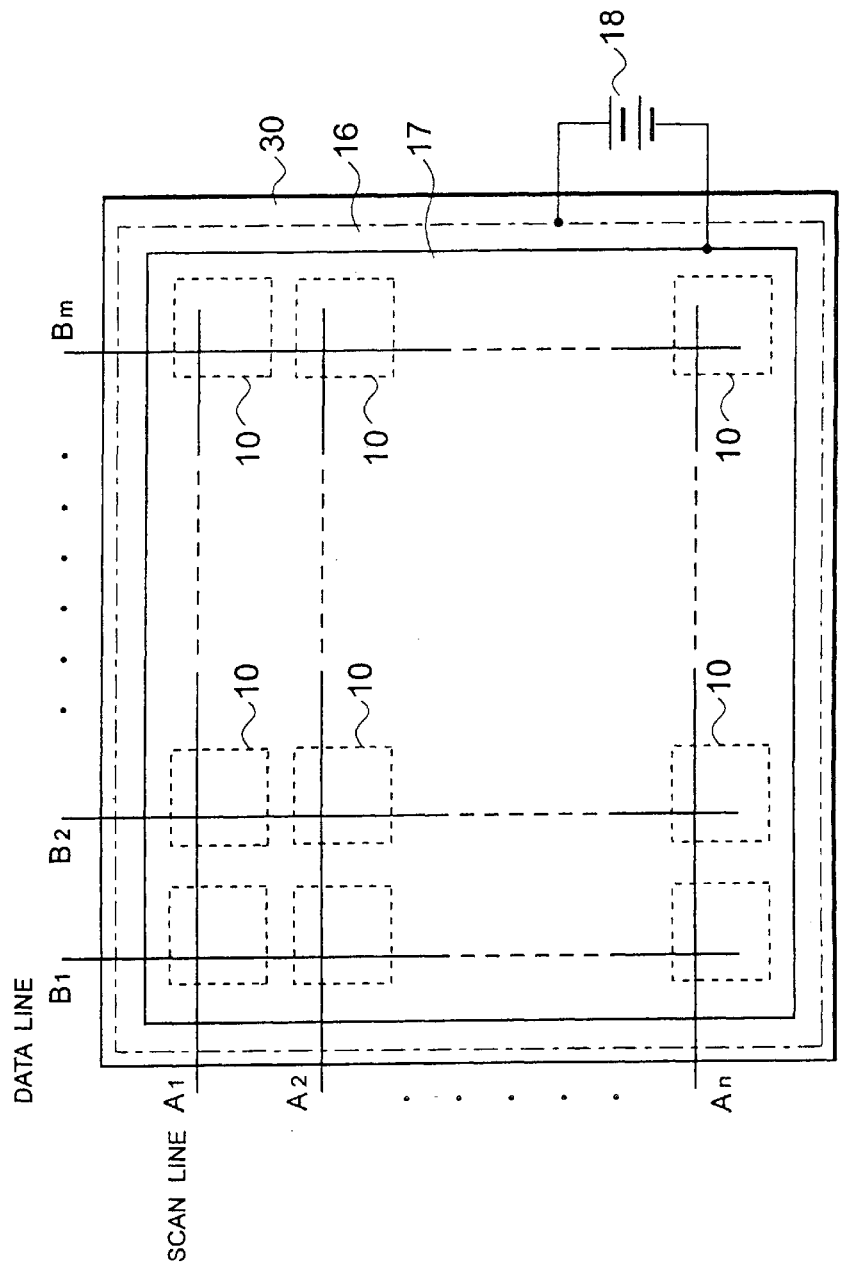
FIG. 2 is a schematic view illustrating the configuration of an active matrix display panel according to a prior art, and a connection of a common anode and the common cathode in the display panel.

The embodiments of the present invention will be described in detail with reference to the accompanying drawings. In the drawings used in the following description, substantially equivalent parts are indicated with the same reference numerals.

Figure 3:
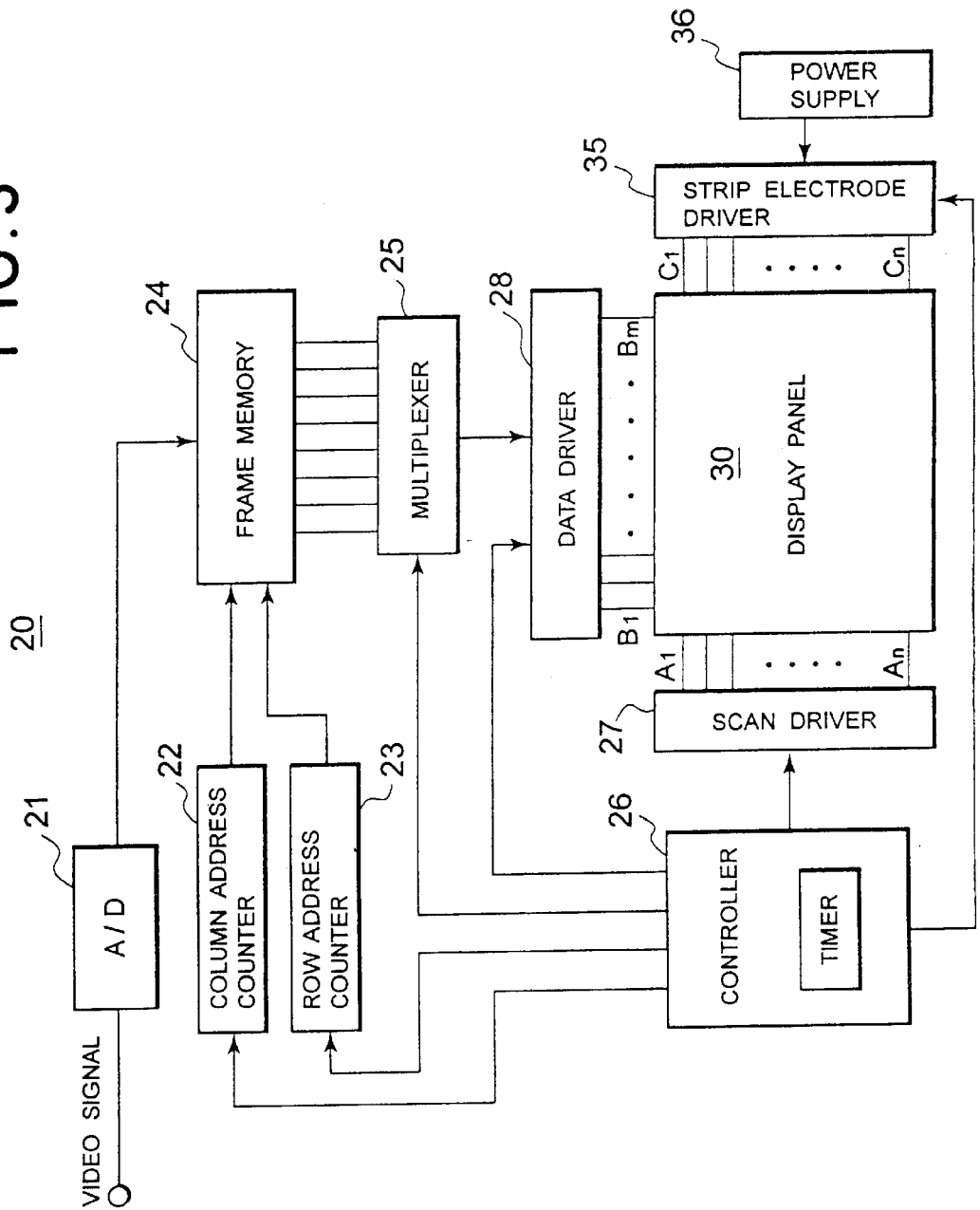
FIG. 3 is a schematic view illustrating the configuration of an organic EL display apparatus that employs an active matrix display panel according to a first embodiment of the present invention.

FIG. 3 schematically illustrates the configuration of an organic EL display apparatus 20 having an active matrix display panel according to a first embodiment of the present invention.

Referring to FIG. 3, an analog-to-digital (A/D) converter 21 receives and converts an analog video signal to a digital video signal. The resulting digital video signal is supplied from the A/D converter 21 to a frame memory 24, and the digital video signal is stored temporarily in the frame memory 24 frame by frame.

A display controller 26 controls each component of the organic EL display apparatus 20. The display controller 26 employs a plurality of sub-fields having different times of light emission as a parameter to control the digital video signals stored in the aforementioned frame memory 24 by means of a column address counter 22 and a row address counter 23. The display controller 26 thereby converts the digital video signals to a plurality of gray scale or gradation display data (i.e., a number of subfields). Then, the data are in turn supplied to a multiplexer 25 in sequence in conjunction with light-emission and non-light-emission data corresponding to the address of pixels of a light-emitting display panel 30.

The display controller 26 controls the data latch circuit of a data driver 28 (not shown) to hold column data, corresponding to each sub-field among the light-emission and non-light-emission data supplied to the multiplexer 25, sequentially from the first row (first scan line) in the order of pixel arrangement.

The display controller 26 supplies the column data held sequentially by the data latch circuit for each sub-field to the display panel 30 for each scan line. The display controller 26 also controls a scan driver 27 to cause the organic EL elements (hereinafter, simply referred to as "EL element(s)") 15, which are contained in a corresponding scan line, to emit light at the same time. In addition, the display controller 26 includes a time measuring device (timer) to control an electrode control driver 35 (hereinafter referred to as the strip-electrode control driver) that is connected to strip electrodes as described later. The strip-electrode control driver 35 is connected with a power supply 36 to control the light emission of and the application of reverse bias voltage to each of the EL elements 15, as described later, under the control of display controller 26.

Figure 4:
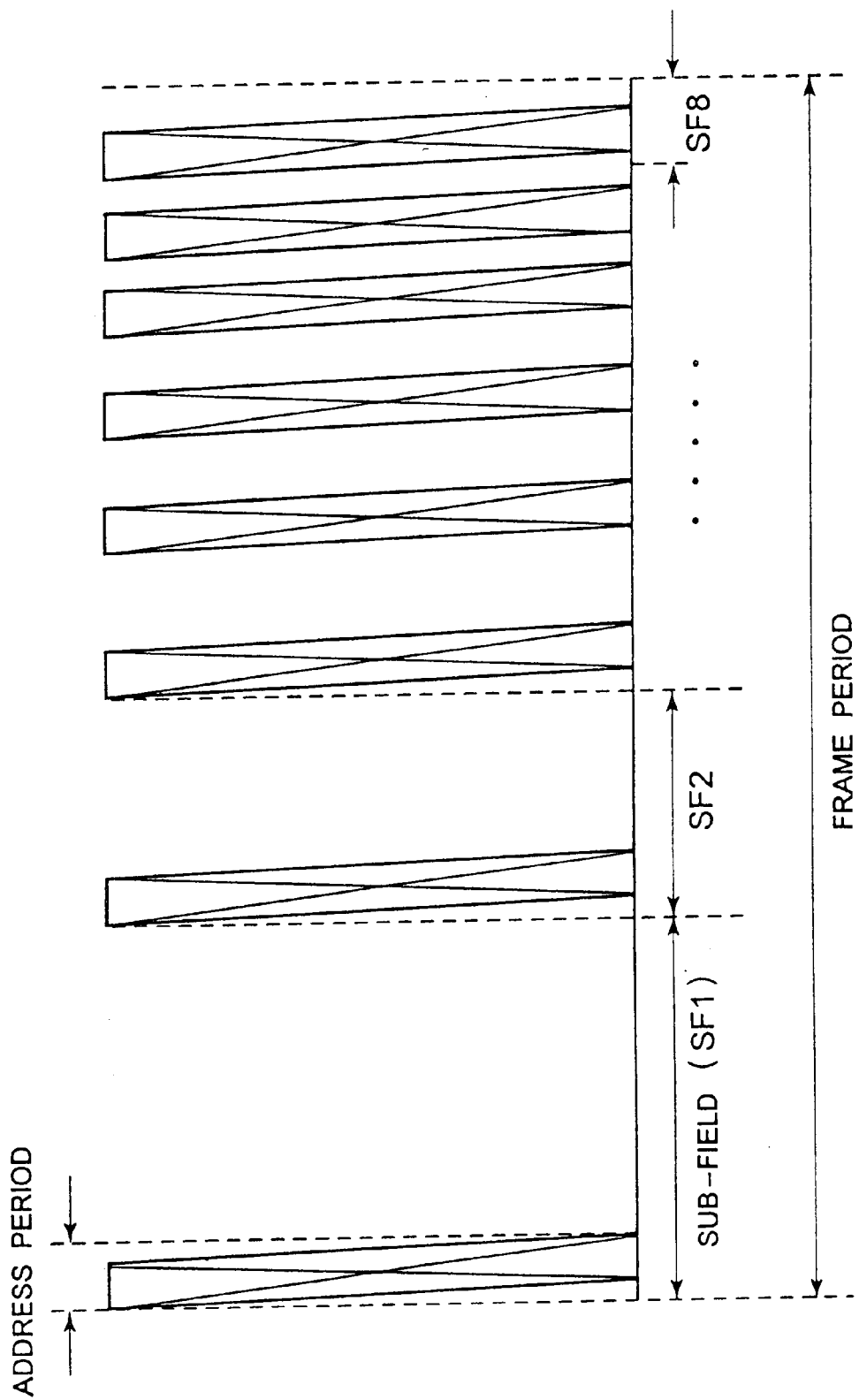
FIG. 4 is a view illustrating a frame period, sub-field periods, and address periods of a digital video signal.

As shown in FIG. 4, in this embodiment, the brightness of gradation is controlled in accordance with a method based on the sub-field $2^n$ gradation method (n=8). More particularly, one frame period of the aforementioned input video signal is divided into 8 sub-fields (SF1 to SF8). Then, the relative ratio of brightness in each sub-field period is set so as to be ½, ¼, ⅛, ¹⁄₁₆, ¹⁄₃₂, ¹⁄₆₄, ¹⁄₁₂₈, and ¹⁄₂₅₆ (that is, $½^1$ through $½^8$). These sub-fields are selectively combined to make it possible to provide 256 levels of gradation.

The control of light emission of each EL element 15 is performed sub-field by sub-field. To be more specific, the control is carried out for each column data of the first to eighth sub-field in the unit of data of one frame (that is, 8 times). Each of the EL elements 15 of the display panel 30 is controlled to emit light only for a predetermined period, as described later, corresponding to each of the sub-fields to be supplied, and thus can perform the light emission display of one frame in multi-levels of gradation. For example, a video image display apparatus that employs such a sub-field $2^n$ gradation method is disclosed in Japanese Patent Laid-Open application Kokai No. H10-312173 by the same applicant as that of the present application.

In this embodiment, the voltage applied to the EL elements and the timing of the application is controlled. More particularly, a reverse bias voltage is applied to the EL elements at predetermined timings. Accordingly, a leak current is prevented from being generated, for example, in a defective portion formed in the organic EL light-emitting layer which leads to defective light emission, since the defective portion can be removed by the application.

Figure 5:
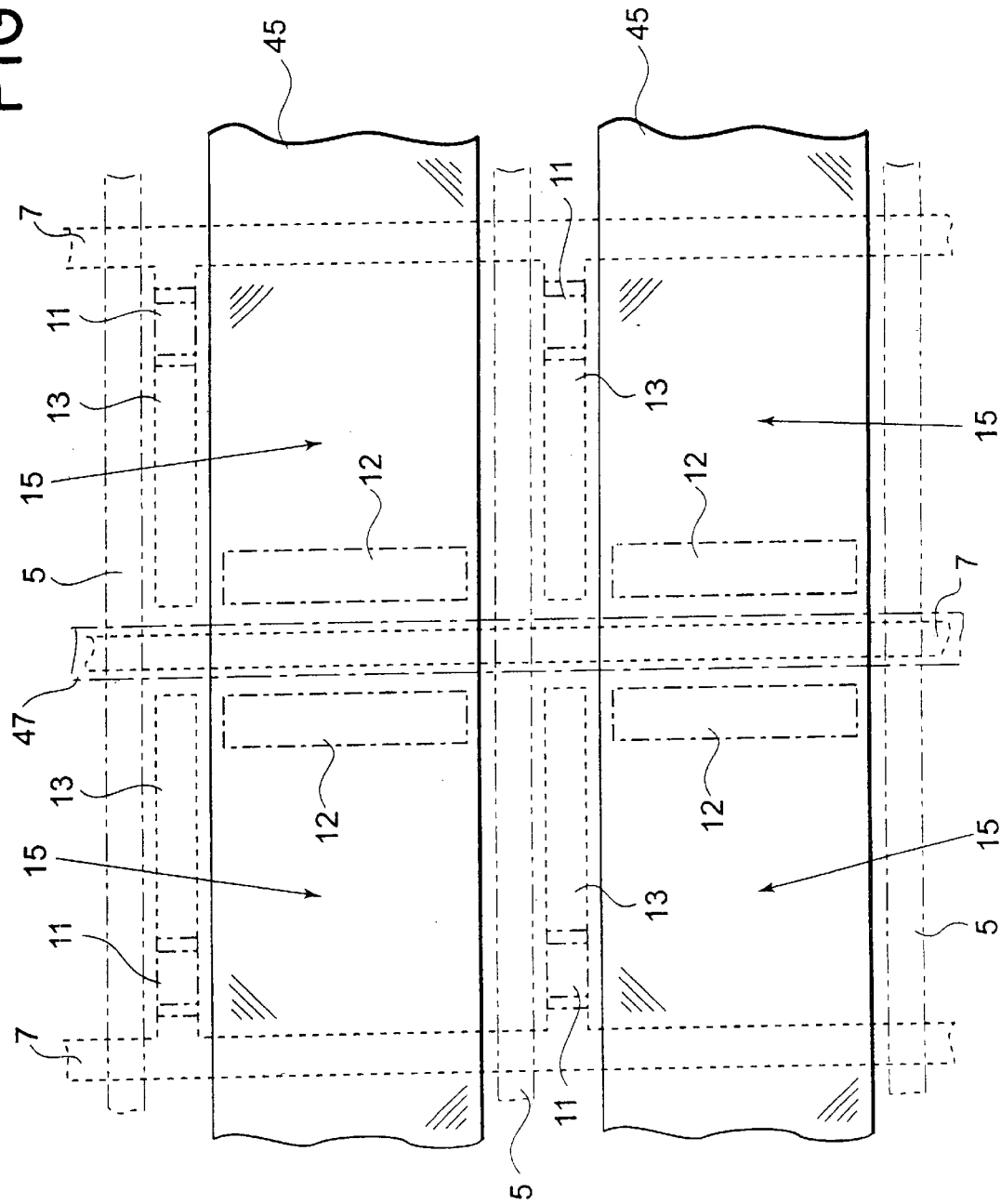
FIG. 5 is a schematic plan view illustrating a part of the configuration of a display panel according to a first embodiment of the present invention.

FIG. 5 is a plan view schematically illustrating a part of the configuration of the display panel 30 viewed from the backside thereof.

The display panel 30 has scan lines 5 and data lines 7 arranged in a matrix configuration on a transparent substrate such as glass. Provided at each intersection of the scan lines 5 and the data lines 7, is an address selection FET 11, a drive FET 12, a capacitor 13, and an EL element 15 that constitutes a light-emitting portion. The configuration of the circuit is the same as that shown in FIG. 1.

On the backside of the display panel 30, strip electrodes 45 (SE1 to SEn) are provided which extend along the scan lines (A1 to An) and each is made of a strip-shaped metal film. The strip electrodes 45 are provided for each scan line, being electrically isolated from one another. The cathode of the EL element 15 ($EL_{k,j}$, J=1 to m) that is connected to the k-th scan line (Ak) via the FETs 11 and 12 is connected to the corresponding strip electrode 45 (SEk). Therefore, the cathodes of the EL elements 15 are electrically isolated from one another for each scan line, so that the EL elements 15 can be independently controlled line by line. On the other hand, the anodes of the EL elements 15 are connected to anode lines 47 via the drive FETs 12. The anode lines 47 are connected electrically to one another to serve as a common anode of the EL elements 15 in the display panel 30. The common anode is connected to a positive voltage ($V_D$) output terminal of the power supply 36.

Figure 6:
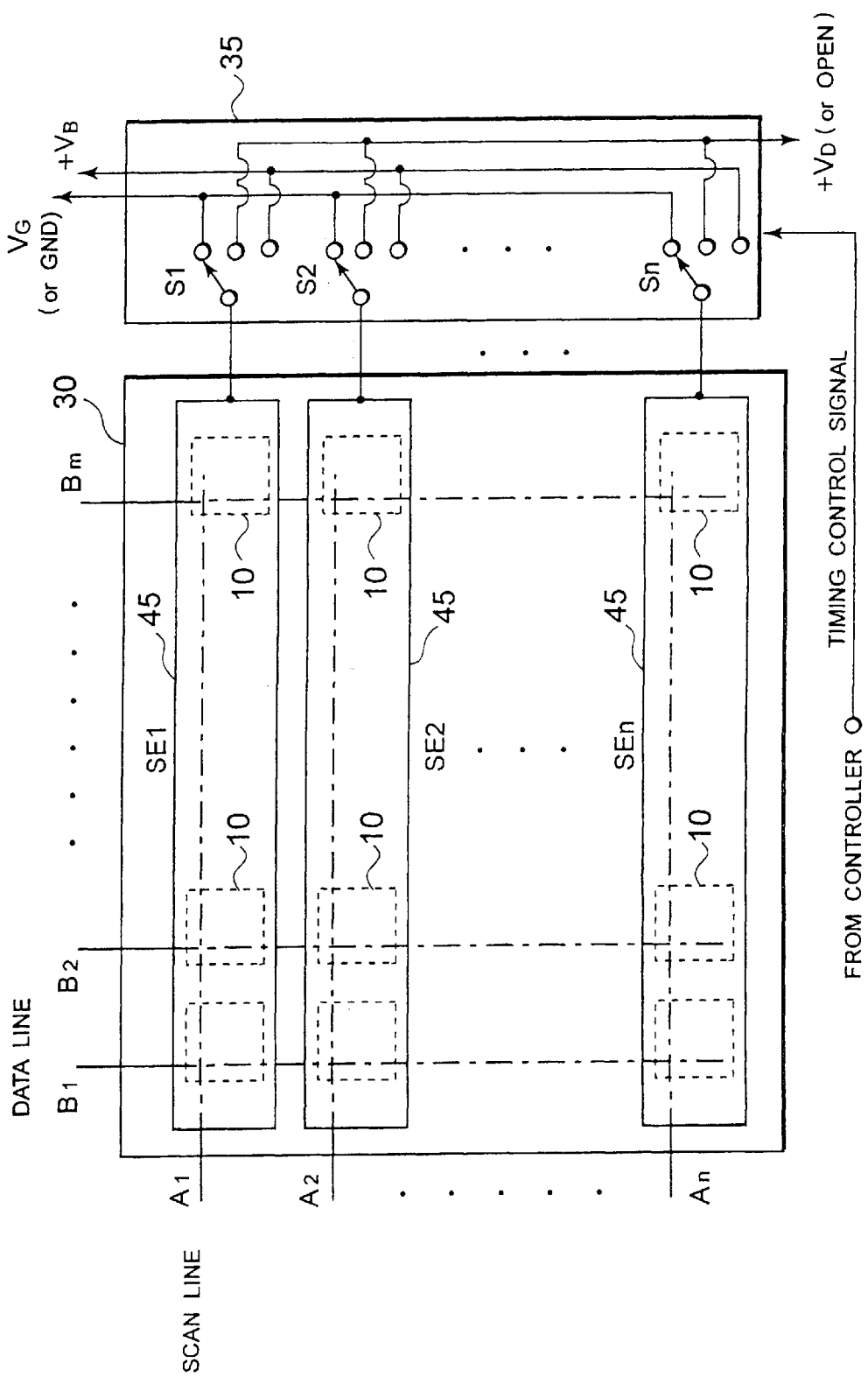
FIG. 6 is a schematic view illustrating a display panel and a strip-electrode control driver according to a first embodiment of the present invention.

FIG. 6 is a schematic view illustrating the display panel 30 and the strip-electrode control driver 35 in the embodiment. Each strip electrode 45 is to be selectively connected to a voltage output terminal $V_G$, $V_B$, or $V_D$ (or made open) of the power supply 36 by means of switches S1 to Sn that are provided inside the strip-electrode control driver 35. Here, the strip electrode 45 is connected to the voltage $V_G$ to allow the EL element 15 to emit light. In other words, the voltage $V_G$ is to be selected in a manner such that a difference in voltage between the voltage $V_G$ and the voltage $V_D$ to be applied to the anode line 47 (=$V_D$-$V_G$) becomes equal to a predetermined drive voltage of the EL element 15. In addition, the anode line 47 is switched to the voltage $V_D$ (or made open) to cause the EL element 15 to stop emitting light. The voltage is not necessarily made equal to $V_D$ but can be such a voltage as to allow the EL element 15 to stop emitting light. Furthermore, the voltage $V_B$ serves to apply the aforementioned reverse bias voltage to the EL elements 15. The voltage $V_B$ is selected such that a difference in voltage between the voltage $V_B$ and the voltage $V_D$ to be applied to the anode line 47 (=$V_D$-$V_B$<0) becomes equal to a predetermined reverse bias voltage. The strip-electrode control driver 35 switches voltages to be applied to each of the strip electrodes 45 in accordance with a control signal from the display controller 26.

The organic EL display apparatus 20 according to the present invention is configured as described above. In response to an input video signal, the device 20 repeats light emission control by address scanning over the entire screen of the display panel sub-field by sub-field, thereby implementing light emission display in multi levels of gradation for each frame.

Figure 7:
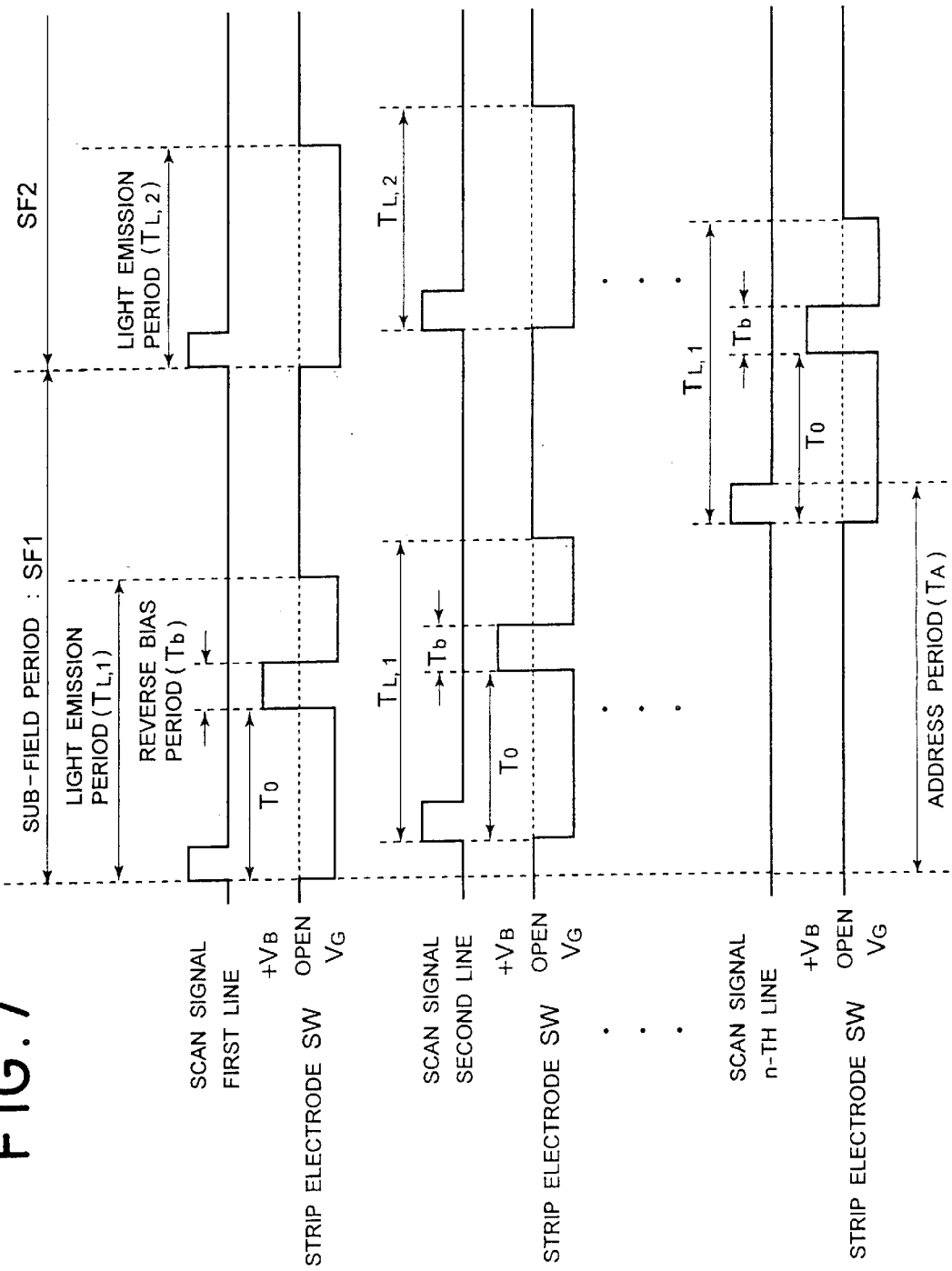
FIG. 7 illustrates time charts of a light-emission control and reverse-bias application operation executed by a display controller in a display panel.

With reference to the time chart illustrated in FIG. 7, explained in detail is the light emission control operation of the display controller 26 for controlling the light emission and non-light emission of the display panel 30 to implement display in multi levels of gradation.

The display controller 26 controls the column address counter 22, the row address counter 23, the frame memory 24, and the multiplexer 25. The display controller 26 thereby converts digital video signal data of one frame to gradation display data corresponding to each sub-field to supply the data to the multiplexer 25. The display data corresponding to the first scan line among display data related to the first sub-field is latched by means of the data latch circuit (not shown) provided in the data driver 28. The display controller 26, then, writes each of the latched column data of the first scan line to each of the corresponding addresses. In other words, the scan driver 27 is caused to transmit an address signal to make each of the address selection FETs 11 conducting of the first scan line. At the same time, the display controller 26 switches the switch S1 of the strip-electrode control driver 35 from an open state (OPEN) to $V_G$. The strip electrode 45 corresponding to the first scan line is thereby connected to the voltage $V_G$, to allow the EL elements 15, which are to emit light in the first scan line, to emit light in response to the video signal data. In other words, the EL elements 15 at the addresses, to which data that indicates light emission are supplied, are caused to emit light.

After light emission has been initiated and a predetermined period ($T_O$) has elapsed, the display controller 26 controls the strip-electrode control driver 35 to switch the switch S1 from $V_G$ to $V_B$. The strip electrode 45 is thereby sustained at the reverse bias voltage during a predetermined reverse bias period ($T_B$). After the predetermined reverse bias period has elapsed, the switch S1 is switched from $V_B$ to $V_G$ to allow the EL element 15 to emit light again. After a predetermined light emission period ($T_{L,1}$) has elapsed from the initiation of light emission, the switch S1 is switched from $V_G$ to an open state (OPEN) to allow the EL element 15 to stop emitting light. In this case, the EL element 15 actually continues emitting light for a period given by subtracting the predetermined reverse bias period from the predetermined light emission period (=$T_{L,1}$-$T_B$)

In the step after the column data of the first scan line has been latched, the display controller 26 executes the light emission of and the application of reverse bias voltage to each EL element 15 of the second scan line, as in the case of the first scan line.

After control operation has been completed for all scan lines or up to the n-th scan line, the display controller 26 executes control of the second sub-field (SF2). The same light emission control is carried out for the second sub-field as in the first sub-field, however, no reverse bias voltage is applied to the strip electrode 45. Like in the second sub-field, light emission control is carried out in the third to the n-th sub-field (SF3 to SFn) without applying a reverse bias voltage thereto. Accordingly, in the embodiment, the application of reverse bias voltage is carried out only in one sub-field period during one frame period. The light emission period of each scan line in each sub-field (SFk) is so controlled as to be the same (=$T_{L,K}$).

Figure 8:
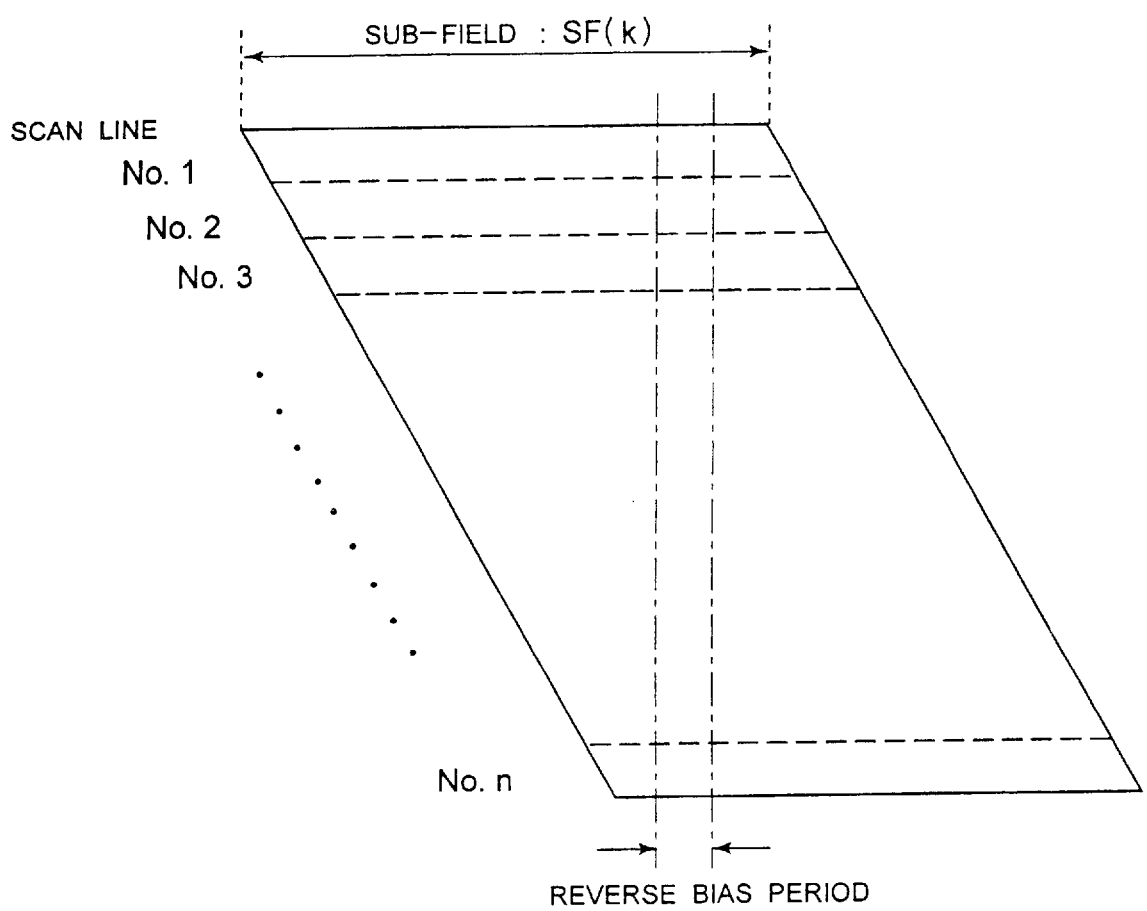
FIG. 8 is a schematic view illustrating the relationship between the sub-field period and the reverse bias period when a reverse bias voltage is applied simultaneously to each scan line.
Figure 9A:
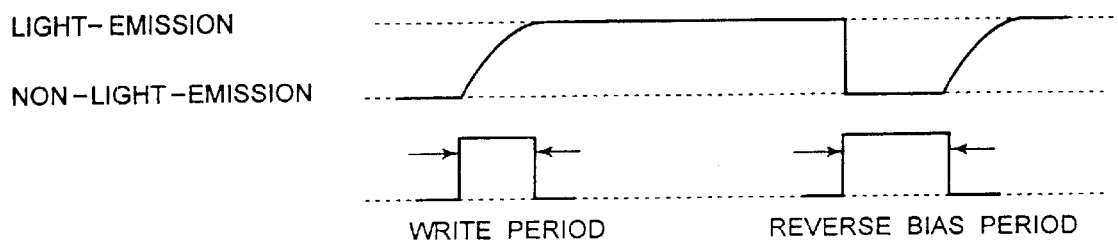
FIGS. 9A through 9C show views illustrating a change in light emission of each scan line in accordance with the relative timing between the write period and the reverse bias voltage period shown in FIG. 8.
Figure 9B:
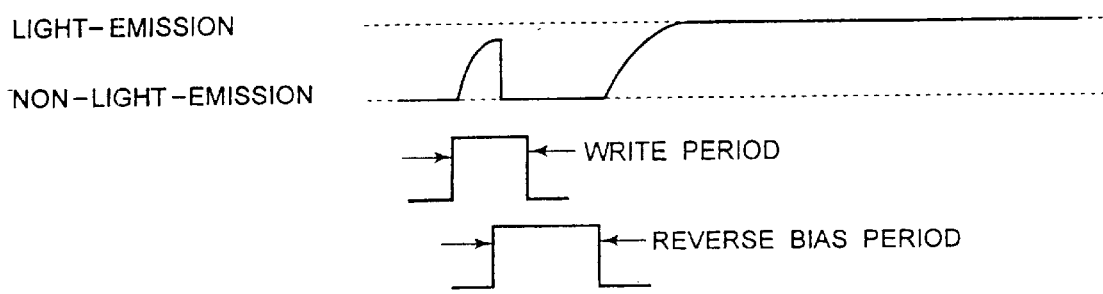
Figure 9C:
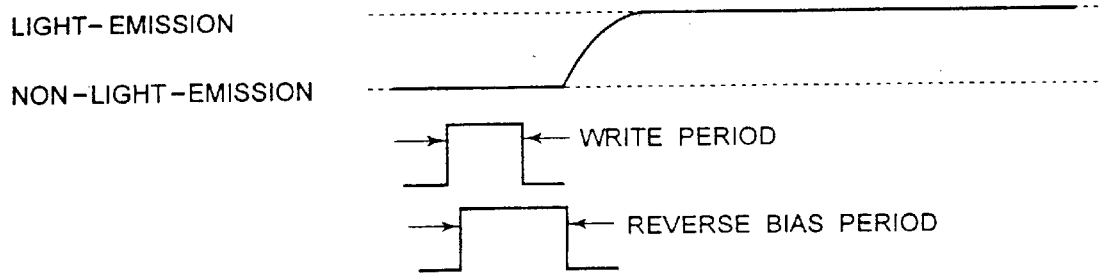

According to the present invention, the application of reverse bias voltage is controlled as described above. This makes it possible to set arbitrarily the timing and duration of the application of the reverse bias voltage for each scan line. On the other hand, for example, when a common electrode is used for each scan line, a reverse bias voltage is applied simultaneously to each scan line as shown in FIG. 8. In this case, the light-emission state of each scan line varies in accordance with the relative timing between the reverse bias voltage period and the write period or the pulse width of an address signal, providing different levels of brightness in each of the scan lines. Different levels of brightness are provided for the cases where the write period and the reverse bias voltage period are apart each other as shown in FIG. 9A, and the periods overlap each other as shown in FIGS. 9B, 9C. The variation in the state of light emission results from the time constant for charging the EL element 15. However, the present invention makes it possible to set the reverse bias voltage period without causing such an adverse effect, and allows a reverse bias voltage to be applied to each scan line while keeping the state of light emission thereof at the same level.

In a case where light emission is ceased (or initiated) in accordance with an address signal, the light emission data of the EL elements 15 cannot be updated until all scan lines have been scanned over. This will not allow the light emission period to be made shorter than the address period ($T_A$), thus causing a disadvantage of limiting the accuracy of displaying the levels of gradation. However, the present invention allows arbitrary setting of the timing of initiating and ceasing of the light emission of the EL elements 15 as described above. This makes it possible to assign to a sub-field an arbitrary light emission period shorter than the address period ($T_A$), which is a period required for scanning over all scan lines, thereby enabling highly accurate display in multi levels of gradation.

Furthermore, the present invention allows arbitrary setting of the light emission period of the EL elements 15 and thereby enables adjustment of brightness according to the length of the period. For example, unlike the brightness adjustment by modifying the amplitude of a brightness control signal supplied to a drive TFT, brightness of a display panel can be adjusted without causing deterioration of the S/N ratio.

In the aforementioned embodiment, explained was a case where the switches of the strip-electrode control driver 35 were controlled to initiate the light emission of the EL elements 15 simultaneously in response to an address signal. However, as described in the foregoing, the timing of initiating and ceasing the light emission can be arbitrarily set.

Furthermore, explained was a case where a reverse bias voltage is applied only in one sub-field period during one frame period, however, the present invention is not limited thereto and can be adapted to apply a reverse bias voltage as appropriate. For example, the reverse bias voltage may be applied once in several frames. In addition, the reverse bias voltage may be applied at any time in one frame period.

Figure 10:
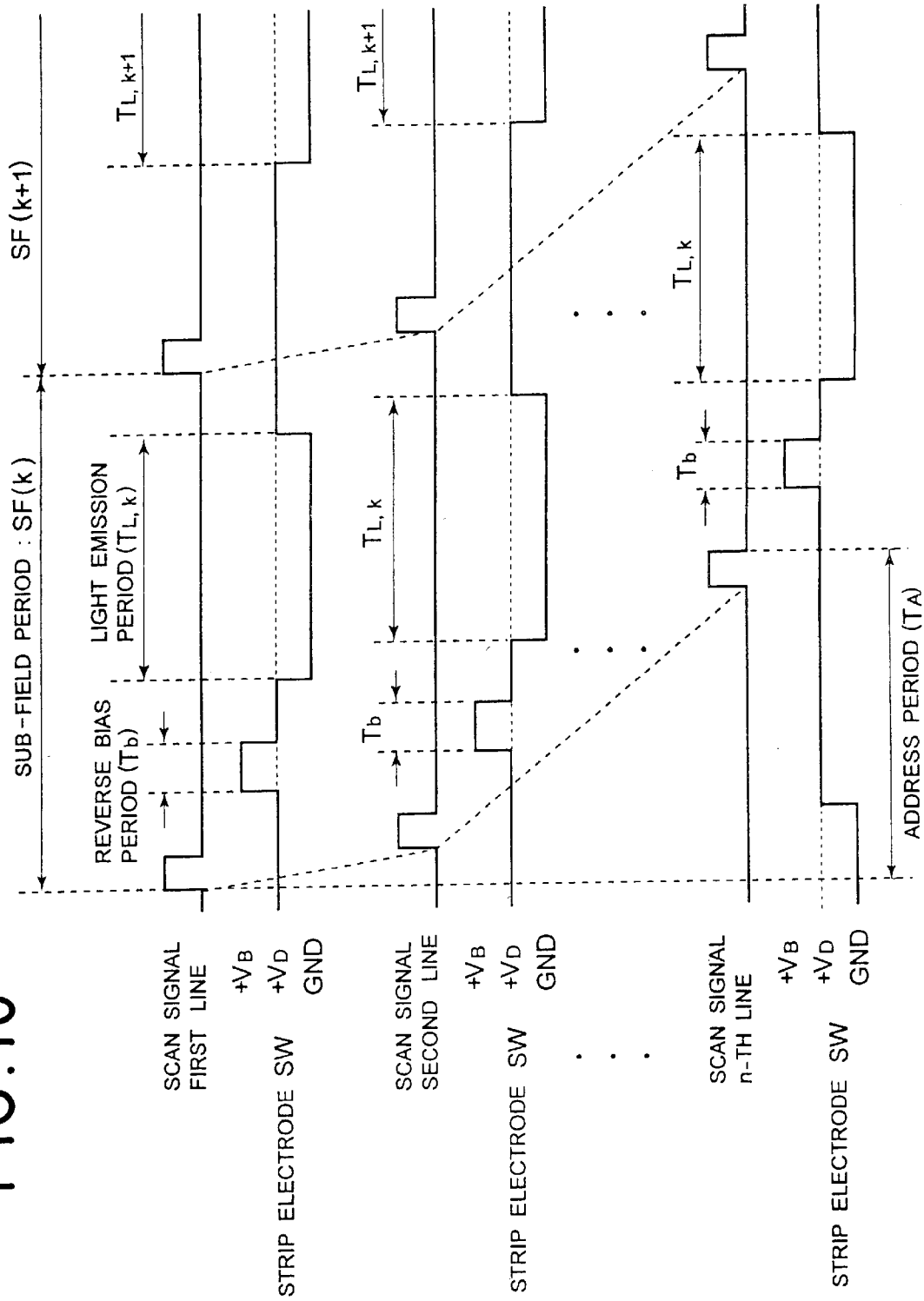
FIG. 10 is a time chart illustrating another example of light emission period and reverse bias voltage period of the display panel according to the first embodiment of the present invention.

FIG. 10 illustrates a time chart of another example of light emission periods and application timing of a reverse bias voltage. The light emission period is set at a predetermined timing in a sub-field period. Additionally, in a sub-field where a reverse bias is applied, the reverse bias application period is provided within a non-light-emission period to avoid overlapping the light emission period.

Figure 11:
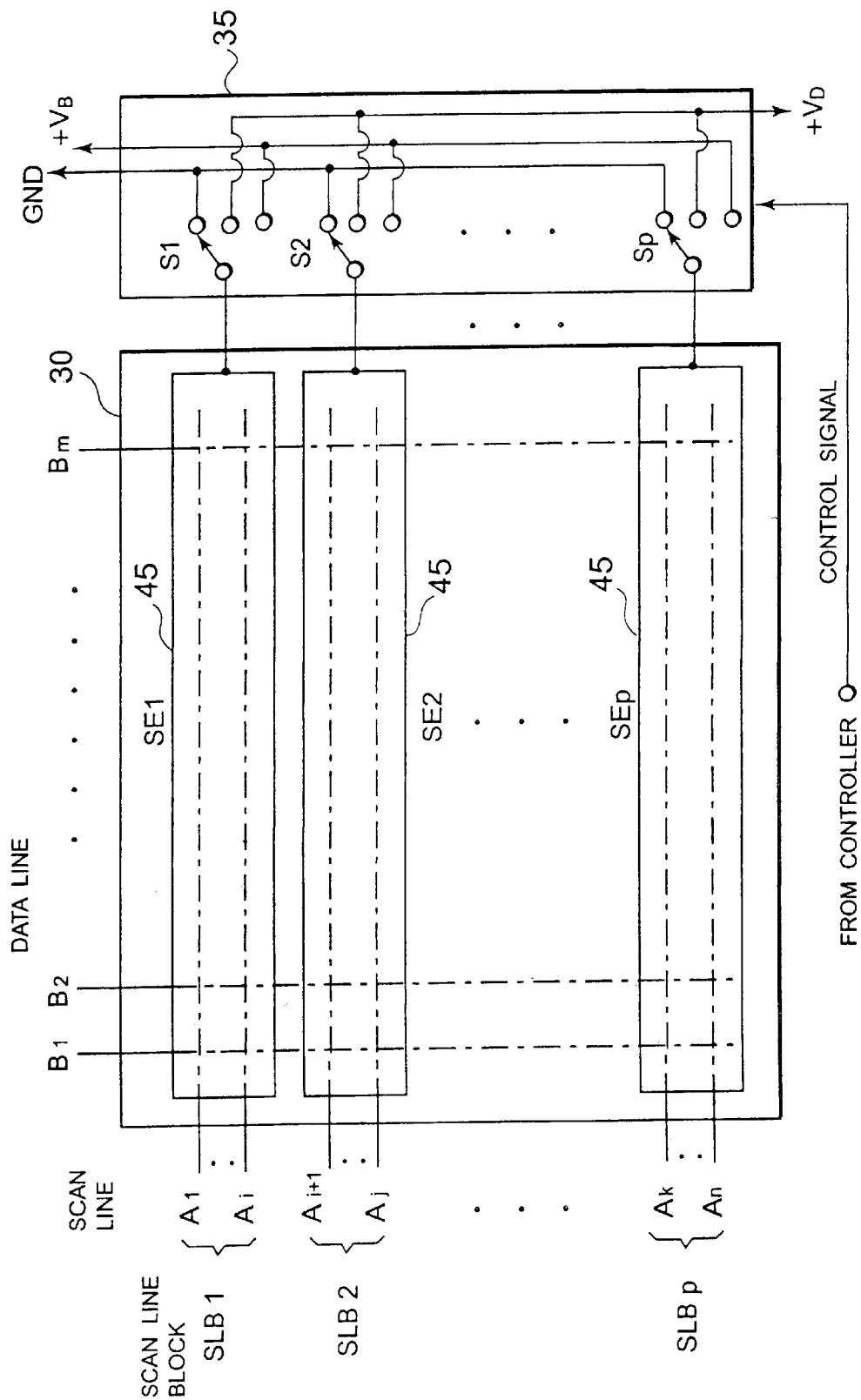
FIG. 11 is a schematic view illustrating the configuration of an active matrix display panel according to a second embodiment of the present invention.

FIG. 11 schematically illustrates the configuration of an active matrix display panel 30 according to a second embodiment of the present invention. The configuration of the organic EL display apparatus 20 is the same as that of the first embodiment.

The embodiment is different from the aforementioned embodiments in that each of the strip electrode 45 of the display panel 30 is provided for each of scan line blocks (SLB1 to SLBp) that includes at least one scan line. More particularly, as shown in FIG. 11, the cathodes of EL elements 15 ($EL_{q,r}$, (q=1 to i, r=1 to m)) on the scan lines (A1 to Ai) included in a scan line block 1 (SLB1) is connected to the same strip electrode 45 (SE1). Likewise, the EL elements 15 included in each of the other scan line blocks (SLB2 to SLBp) are connected to each of the strip electrodes 45 (SE2 to SEp). In other words, the cathodes of EL elements 15 included in one scan line block are electrically isolated from those included in another scan line block.

Furthermore, the strip-electrode control driver 35 switches each of the switches S1–Sp in response to a control signal from the display controller 26. Each of the strip electrodes 45 is thereby selectively connected to a voltage output terminal $V_B$, $V_D$, or the ground potential (GND) of the power supply 36. The strip electrode 45 is connected to the ground potential (GND) to allow the EL elements 15 to emit light, and to $V_D$, which is the same voltage as that of the common electrode, to cease the light emission. The strip electrode 45 is connected to the voltage $V_B$ to apply a reverse bias voltage thereto. As such, each of the strip electrodes 45 can be connected controllably and independently of the other for each scan line block.

Figure 12:
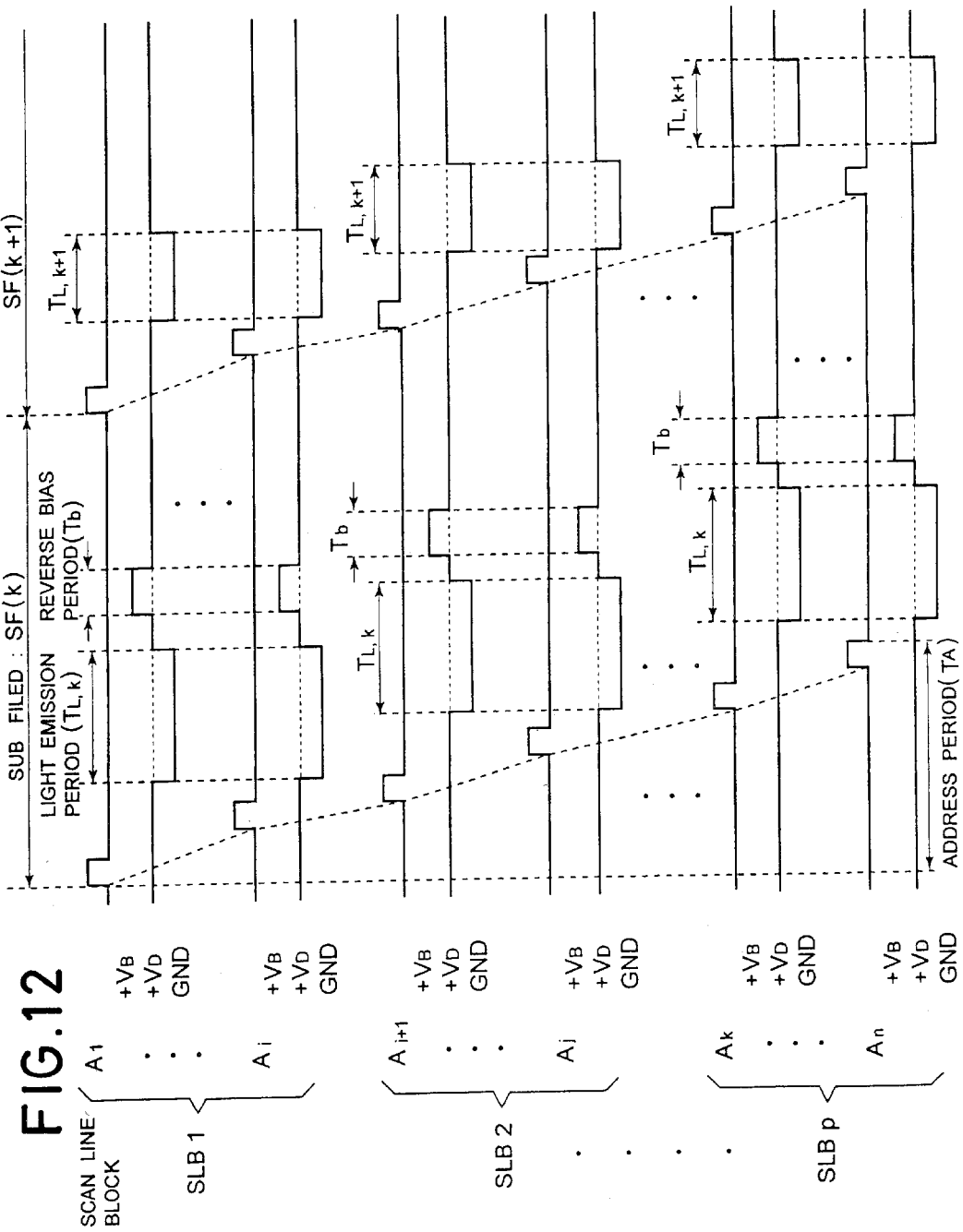
FIG. 12 is a time chart illustrating a control operation executed by the display controller in the display panel of FIG. 11.

FIG. 12 illustrates a time chart of the control operation of the display panel 30 to be carried out by the display controller 26. The operation is different from that of the first embodiment, where control is carried out for each scan line. In the embodiment, the control of light emission and application of reverse bias voltage to the EL element 15 are carried out for each scan line block. In each scan line block, the light emission control and the application of reverse bias voltage are carried out for the scan lines included in the same scan line block at the same time. Furthermore, the length of light emission period of each sub-field is controlled to be constant ($T_{L,K}$) for all scan line blocks within the same sub-field (SFk).

Figure 13:
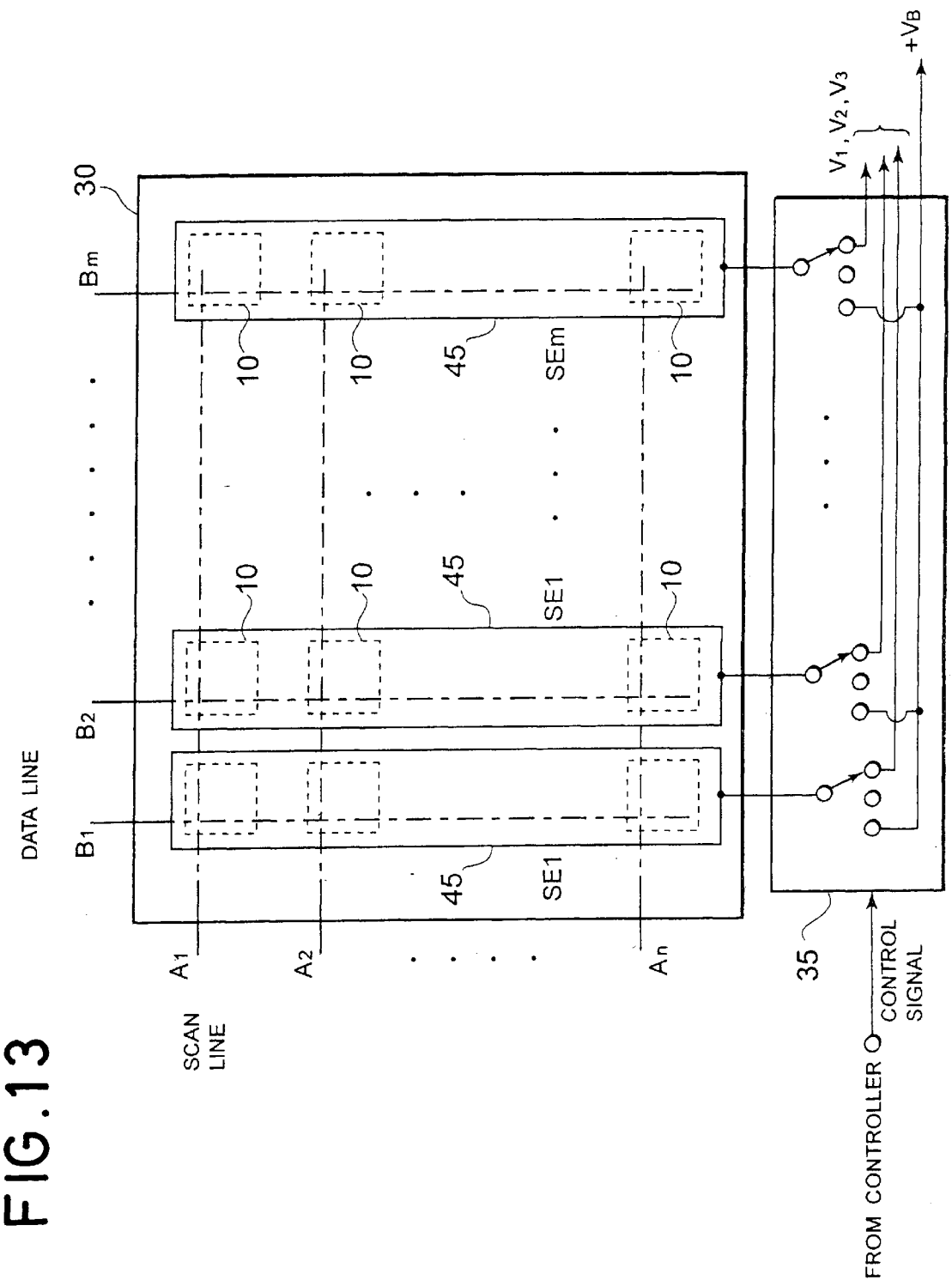
FIG. 13 is a schematic view illustrating the configuration of the active matrix display panel according to the second embodiment of the present invention.

FIG. 13 schematically illustrates the configuration of an active matrix display panel 30 according to a third embodiment of the present invention. The configuration of the organic EL display apparatus 20 is the same as that of the first embodiment.

The embodiment is different from the aforementioned embodiments in that the strip electrodes 45 (SE1 to SEm) of the display panel 30 are formed along data lines (B1 to Bm). The strip electrodes 45 are provided for each of the data lines, being electrically isolated from one another. The cathodes of EL elements 15 ($EL_{j,k}$, j=1 to n) on the k-th data line (Bk) are connected to the corresponding strip electrode 45 (SEk). The voltage of each of the strip electrodes 45 can be selectively switched by means of the switches provided in the strip-electrode control driver 35. The EL elements 15 included in a data line of the display panel 30 can be controlled independently of those included in another, thereby making it possible to provide a high degree of flexibility in the EL elements 15.

For example, the present invention can be applied to a color display panel 30 in which three types of EL elements 15 that emit red, green, and blue light are arranged alternately. In this case, the EL elements 15 of one color type are connected to one of the strip electrodes 45. As shown in FIG. 13, each of the strip electrodes 45 is connected to a predetermined one of the three types of output voltages ($V_1$, $V_2$, $V_3$) of the power supply 36 in accordance with the type of the EL elements 15 connected to the strip electrode 45. Therefore, the optimum voltage can be applied to the EL elements 15 in accordance with the type thereof.

FIG. 14 is a time chart illustrating the control operation for the strip electrodes 45 that are connected to the voltage $V_1$ at the time of light emission in the aforementioned color display panel 30. In each scan line, the EL elements 15 emit light at the same time and a reverse bias voltage is applied thereto at the same time. The strip electrodes 45 connected voltages $V_2$, $V_3$ are controlled in the same manner. Moreover, not only the applied voltage but also the light emission period may be varied depending on the type of the EL elements 15.

In the aforementioned embodiment, explained was an example in which the cathodes were electrically isolated with using the strip electrodes. However, the anodes may be electrically isolated with using the strip electrodes in the same manner.

Furthermore, the aforementioned embodiments are presented as examples and can be used in combination with one another as appropriate.

As described above, the present invention allows the strip electrodes, which are electrically isolated from one another, to be provided for at least every one scan line or every one data line. Accordingly, the voltage applied to light-emitting elements and the timing of the application can be controlled without restraint, thus providing highly stable and highly accurate display in multi levels of gradation.

The invention has been described with reference to the preferred embodiments thereof. It should be understood by those skilled in the art that a variety of alterations and modifications may be made from the embodiments described above. It is therefore contemplated that the appended claims encompass all such alternations and modifications.

What is claimed is:

1. An active matrix display apparatus, comprising:
    a display panel including a plurality of light-emitting elements arranged at intersections of scan lines and data lines arranged in a matrix configuration, a drive circuit for driving each of said plurality of light-emitting elements, and a conductive portion connected to one terminal of each of said plurality of light-emitting elements,
    a display controller for controlling said drive circuit in response to an input video signal, and
    a power supply for generating a first voltage and a second voltage, said first voltage corresponding to a voltage to allow said plurality of light-emitting elements to emit light and said second voltage corresponding to a voltage to prohibit said plurality of light-emitting elements from emitting light,
    wherein said conductive portion includes a plurality of strip electrodes each provided for at least one of said scan lines and electrically isolated from one another, and said power supply includes a switch circuit for selectively connecting each of said plurality of strip electrodes to either one of said first voltage, said second voltage and an open state for stopping current flow.

2. A display apparatus according to claim 1, further comprising:
    a reverse bias voltage generating circuit for generating reverse bias voltage in a direction opposite to a voltage applied to said light-emitting elements when emitting light, and a reverse bias voltage applying circuit for selectively applying said reverse bias voltage to said plurality of light-emitting elements via said plurality of strip electrodes.

3. A display apparatus according to claim 2, wherein said display controller includes a timer and controls said switch circuit in response to an output of said timer to selectively connect each of said plurality of strip electrodes to said reverse bias generating circuit.

4. A display apparatus according to claim 1, wherein said display controller includes a timer and controls said switch circuit in response to an output of said timer to selectively connect each of said plurality of strip electrodes to either one of said first voltage and said second voltage.

5. An active matrix display apparatus, comprising:
    a display panel including a plurality of light-emitting elements arranged at intersections of scan lines and data lines arranged in a matrix configuration, a drive circuit for driving each of said plurality of light-emitting elements, and a conductive portion connected to one terminal of each of said plurality of light-emitting elements,
    a display controller for controlling said drive circuit in response to an input video signal, and
    a power supply for generating a first voltage and a second voltage, said first voltage corresponding to a voltage to allow said plurality of light-emitting elements to emit light and said second voltage corresponding to a voltage to prohibit said plurality of light-emitting elements from emitting light,
    wherein said conductive portion includes a plurality of strip electrodes each provided for at least one of said data lines and electrically isolated from one another, and said power supply includes a switch circuit for selectively connecting each of said plurality of a strip electrodes to either one of said first voltage, said second voltage and an open state for stopping current flow.

6. A display apparatus according to claim 5, further comprising:
    a reverse bias voltage generating circuit for generating reverse bias voltage in a direction opposite to a voltage applied to said light-emitting elements when emitting light, and a reverse bias voltage applying circuit for selectively applying said reverse bias voltage to said plurality of light-emitting elements via said plurality of strip electrodes.

7. A display apparatus according to claim 6, wherein said display controller includes a timer and controls said switch circuit in response to an output of said timer to selectively connect each of said plurality of strip electrodes to said reverse bias generating circuit.

8. A display apparatus according to claim 5, wherein said display controller includes a timer and controls said switch circuit in response to an output of said timer to selectively connect each of said plurality of strip electrodes to either one of said first voltage and said second voltage.

9. An active matrix display panel, comprising:
    a plurality of light-emitting elements arranged at intersections of scan lines and data lines arranged in a matrix configuration,
    a drive circuit for driving each of said plurality of light-emitting elements,
    a conductive portion connected to one terminal of each of said plurality of light-emitting elements, said conductive portion including a plurality of strip electrodes each provided for at least one of said scan lines and electrically isolated from one another,
    a receiving circuit for receiving a first voltage, a second voltage and a brightness control signal, and
    a switch circuit for selectively connecting each of said plurality of strip electrodes to either one of said first voltage and said second voltage in response to said brightness control signal.

10. A display panel according to claim 9, further comprising:

a reverse bias voltage generating circuit for generating reverse bias voltage in a direction opposite to a voltage applied to said light-emitting elements when emitting light, and a reverse bias voltage applying circuit for selectively applying said reverse bias voltage to said plurality of light-emitting elements via said plurality of strip electrodes.

11. An active matrix display panel, comprising:

a plurality of light-emitting elements arranged at intersections of scan lines and data lines arranged in a matrix configuration, a drive circuit for driving each of said plurality of light-emitting elements, a conductive portion connected to one terminal of each of said plurality of light-emitting elements, said conductive portion including a plurality of strip electrodes each provided for at least one of said data lines and electrically isolated from one another, a receiving circuit for receiving a first voltage, a second voltage and a brightness control signal, and a switch circuit for selectively connecting each of said plurality of strip electrodes to either one of said first voltage and said second voltage in response to said brightness control signal.

12. A display panel to claim 11, further comprising:

a reverse bias voltage generating circuit for generating reverse bias voltage in a direction opposite to a voltage applied to said light-emitting elements when emitting light, and a reverse bias voltage applying circuit for selectively applying said reverse bias voltage to said plurality of light-emitting elements via said plurality of strip electrodes.

* * * * *